United States Patent
Francis et al.

(10) Patent No.: US 9,359,693 B2
(45) Date of Patent: Jun. 7, 2016

(54) GALLIUM-NITRIDE-ON-DIAMOND WAFERS AND MANUFACTURING EQUIPMENT AND METHODS OF MANUFACTURE

(71) Applicant: Element Six Technologies US Corporation, Santa Clara, CA (US)

(72) Inventors: Daniel Francis, Oakland, CA (US); Firooz Faili, Los Gatos, CA (US); Kristopher Matthews, San Francisco, CA (US); Frank Yantis Lowe, Phoenix, AZ (US); Quentin Diduck, Ithaca, NY (US); Sergey Zaytsev, Albany, CA (US); Felix Ejeckam, San Francisco, CA (US)

(73) Assignee: ELEMENT SIX TECHNOLOGIES US CORPORATION, Santa Clara, CA (US)

( * ) Notice: Subject to any disclaimer, the term of this patent is extended or adjusted under 35 U.S.C. 154(b) by 530 days.

(21) Appl. No.: 13/781,054

(22) Filed: Feb. 28, 2013

(65) Prior Publication Data

US 2013/0298823 A1  Nov. 14, 2013

Related U.S. Application Data

(60) Provisional application No. 61/604,979, filed on Feb. 29, 2012.

(51) Int. Cl.
*C30B 25/16* (2006.01)
*C30B 25/10* (2006.01)
(Continued)

(52) U.S. Cl.
CPC .............. *C30B 25/16* (2013.01); *C23C 16/271* (2013.01); *C23C 16/463* (2013.01); *C30B 25/10* (2013.01); *C30B 25/18* (2013.01); *C30B 25/183* (2013.01); *C30B 25/205* (2013.01); *C30B 29/04* (2013.01); *H01L 21/0245* (2013.01);
(Continued)

(58) Field of Classification Search
CPC .... C23C 16/271; C23C 16/463; C30B 25/10; C30B 25/16; C30B 25/18; C30B 25/183; C30B 25/205; C30B 29/04; H01L 21/02389; H01L 21/02488; H01L 21/02527; H01L 21/0262; H01L 21/02658; H01L 29/2003; H01L 29/7786
See application file for complete search history.

(56) References Cited

U.S. PATENT DOCUMENTS 5,650,639 A  7/1997 Schrantz et al.
6,200,652 B1  3/2001 Sun et al.
(Continued)

OTHER PUBLICATIONS

Germain et al., "Surface Stabilization for Higher Performance AlGaN/GaN HEMT with In-situ MOVPE SiN," Mater. Res. Soc. Symp. Proc. vol. 831, E6.7.1 to E6.7.6.*
(Continued)

*Primary Examiner* — Michael Kornakov
*Assistant Examiner* — Hua Qi
(74) *Attorney, Agent, or Firm* — Bryan Cave LLP

(57) ABSTRACT

A method for integrating wide-gap semiconductors, and specifically, gallium nitride epilayers, with synthetic diamond substrates is disclosed. Diamond substrates are created by depositing synthetic diamond onto a nucleating layer deposited or formed on a layered structure that comprises at least one layer of gallium nitride. Methods for manufacturing GaN-on-diamond wafers with low bow and high crystalline quality are disclosed along with preferred choices for manufacturing GaN-on-diamond wafers and chips tailored to specific applications.

5 Claims, 12 Drawing Sheets

(51) Int. Cl.

| | | |
|---|---|---|
| *C30B 25/18* | (2006.01) | |
| *C30B 25/20* | (2006.01) | |
| *C30B 29/04* | (2006.01) | |
| *H01L 21/02* | (2006.01) | |
| *C23C 16/27* | (2006.01) | |
| *C23C 16/46* | (2006.01) | |
| *H01L 29/20* | (2006.01) | |
| *H01L 29/778* | (2006.01) | |
| *H01L 21/18* | (2006.01) | |

(52) U.S. Cl.
CPC ....... *H01L 21/0254* (2013.01); *H01L 21/0262* (2013.01); *H01L 21/02381* (2013.01); *H01L 21/02389* (2013.01); *H01L 21/02488* (2013.01); *H01L 21/02527* (2013.01); *H01L 21/02658* (2013.01); *H01L 21/187* (2013.01); *H01L 29/2003* (2013.01); *H01L 29/7786* (2013.01)

(56) References Cited

U.S. PATENT DOCUMENTS

| | | |
|---|---|---|
| 6,582,780 B1 | 6/2003 | Tolt |
| 6,794,276 B2 | 9/2004 | Letertre et al. |
| 7,033,912 B2 | 4/2006 | Saxler |
| 7,358,152 B2 | 4/2008 | Kub et al. |
| 7,595,507 B2 | 9/2009 | Francis et al. |
| 2004/0112274 A1* | 6/2004 | Tsujimoto ............. C03C 17/004 117/2 |
| 2005/0025973 A1 | 2/2005 | Slutz et al. |
| 2006/0266280 A1* | 11/2006 | Francis ............. H01L 21/02381 117/68 |
| 2007/0267654 A1 | 11/2007 | Chakraborty et al. |
| 2008/0241413 A1 | 10/2008 | Ravi et al. |
| 2008/0296586 A1* | 12/2008 | Francis ................. G01T 1/24 257/77 |
| 2009/0017258 A1 | 1/2009 | Carlisle et al. |
| 2009/0146185 A1* | 6/2009 | Suh .................. H01L 29/2003 257/194 |
| 2009/0166669 A1* | 7/2009 | Kim ................. H01L 21/02458 257/103 |
| 2010/0105166 A1 | 4/2010 | Francis et al. |
| 2010/0109126 A1* | 5/2010 | Arena ................ H01L 21/0242 257/615 |

OTHER PUBLICATIONS

Heying et al., In situ SiN passivation of AlGaN/GaN HEMTs by molecular beam epitaxy, Electronics Letters, 2007, 43 (14), 779-780.
Germain et al., Surface stabilization for higher performance AlGaN/GaN HEMT with in-situ MOVPE SiN, MRS Proceedings, 2005, 831, E6.7.

* cited by examiner

GALLIUM-NITRIDE-ON-DIAMOND WAFERS AND MANUFACTURING EQUIPMENT AND METHODS OF MANUFACTURE

RELATED APPLICATIONS

This application claims priority to U.S. Provisional Patent Application Ser. No. 61/604,979 filed Feb. 29, 2012. The disclosure is incorporated herein by reference.

FIELD OF THE INVENTION

The present invention relates to high-power electronic and optoelectronic devices and their thermal management, and particularly relates to methods for fabricating devices and structures that include integration of synthetic diamond films and wafers with wide-gap semiconductors, and more particularly with gallium nitride-based electronic and optoelectronic devices; including high-electron mobility transistors, radio-frequency (RF) electronic devices, light-emitting-diodes, and lasers.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic device while maximizing performance (power and speed) and reliability. Examples of such devices are microwave transistors, light-emitting diodes and lasers. Depending on the frequency of operation, power requirements, and specific application, these devices have been conventionally made on silicon, gallium arsenide (GaAs), or indium phosphide (InP). In recent years, gallium nitride (GaN), aluminum nitride (AlN) and other wide-gap semiconductors have surfaced as new choices for both power electronics and visible-light generating optoelectronics. Gallium nitride material systems give rise to microwave transistors with high-electron mobility (necessary for high-speed operation), high breakdown voltage (necessary for high power), and thermal conductivity that is greater than GaAs, InP, or silicon, and thus suitable for use in high power applications. GaN is also used in manufacturing of blue and ultraviolet lasers and light-emitting diodes. In spite of the high-temperature performance (owing to its wide bandgap and high critical field), GaN electronic and optoelectronic devices are limited in performance due to relatively low thermal resistance of the substrates commonly used for growth of GaN. This deficiency is most pronounced in high-power microwave and millimeter-wave transistors and amplifiers where reduced cooling requirements and longer device life, both benefiting from lower junction temperature, are in critical demand. Similar need is exhibited in high power blue and ultraviolet lasers where several-micrometer-wide laser cavity stripe dissipates power into the chip though low thermal conductance materials.

It is well known that diamond is the most thermally conductive substance known to man. For this reason, the semiconductor industry has been employing diamond heat-sinks and heat spreaders for improved thermal management since the commercialization of synthetic diamond by chemical-vapor deposition in the 1980's. The objective of optimal heat management is to bring the diamond heat-spreader or diamond layers to close proximity with the heat source in the electronic or optoelectronic devices. This means building devices on thin chips and mounted on diamond heat-spreaders, coating devices with diamond layers, and in more recent times transferring device epilayers onto diamond.

Diamond wafers are manufactured by chemical vapor deposition (CVD) by one of three methods: plasma enhanced diamond CVD where the energy to dissociate the reactants comes from a microwave source, hot-filament enhanced diamond CVD where the energy for dissociating gases comes from a hot tungsten filament, and high voltage torch where ions are accelerated using a high DC voltage.

The CVD process is carried out in a vacuum chamber within which a substrate on top of which diamond will be grown is provided and which is exposed to the energy source needed to dissociate the molecules of precursor gases needed to form diamond on the surface of the substrate. The precursor gases needed in the chemical vapor deposition of diamond are a source of carbon, typically methane (CH4), ethane (C2H6), carbon monoxide (CO), and acetylene (C2H2), diluted in hydrogen (H2). The gas combination needed for efficient diamond deposition contains a small (several percent) composition of the carbon-carrying gas in hydrogen, and the reaction can be further assisted with very small percentage of oxygen (O2). The preferred carbon-carrying gas in these reactions is methane.

GaN-on-diamond technology and resulting devices (described in U.S. Pat. No. 7,595,507) involve structures which feature atomically attached GaN epilayers to diamond substrates. This technology enables bringing together the best heat conductor (diamond) with electronic and optoelectronic devices based on gallium-nitride (GaN) and GaN-related compounds. Due to its inherent high critical electrical field and wide bandgap, gallium nitride devices are preferred for high power electrical and optoelectronic applications, such as, high power RF transistors and amplifiers, power management devices (Schottky diodes and switching transistors), as well as high power blue and ultraviolet lasers or light-emitting diodes.

GaN is presently grown on several different substrates: sapphire, silicon, silicon carbide, aluminum nitride, single-crystal diamond, and GaN substrates. With the exception of GaN substrates, all other materials have lattice constants that differ from that of GaN and AlGaN. In order to epitaxially grow high-quality AlGaN alloys on top of substrates with lattice constant different from GaN or the AlGaN alloys, it has been common practice in the industry to grow a layer or a combination of layers on top of the lattice-mismatched substrate in order to terminate the dislocations and produce a lower dislocation density epilayer on top of which growth of a high-quality active layer is possible. The layers grown directly on top of the lattice-mismatched substrate are commonly referred to as transition or nucleation layer or layers, and they can include any number of binary or ternary epitaxial layers. The nucleation layers are then followed by a suitably thick gallium-nitride layer, referred to as the buffer layer, which is added for achieving low dislocation density GaN and distancing the active layers from the highly dislocated nucleation layers. The top surface of the buffer layer generally features high quality material with dislocation density that is sufficiently low to allow the growth of device active layers. Typical dislocation densities achievable for GaN surface grown on silicon, silicon carbide, and sapphire epi-wafers for use in field-effect applications can be between $10^8$ 1/cm$^2$ and $10^{10}$ 1/cm$^2$. Defect density required for efficient operation of bipolar devices, such as, bipolar transistors and optoelectronic devices ranges from $10^6$ 1/cm$^2$ to $10^8$ 1/cm$^2$. The GaN buffer layer is often required as a part of the active epilayer structure. For the purposes of this application, the term "transition layers" means all of the layers grown on top of the native substrate and these are needed to (a) convert the lattice constant of the native substrate to that of GaN, and (b) achieve high quality material, i.e. dislocation density low enough to allow the growth of the desired active layer on top.

The term device "active layers" refers to epilayer structure and structures required for realization of electronic devices such as a high-frequency transistor, high-voltage switch, Schottky diode, and/or optoelectronic devices such as laser diodes, light-emitting diodes, and super-luminescent diodes. As the GaN buffer layer may serve a function within the active layer and the transition layers, the boundary between the transition layers and the active layers may fall somewhere within the buffer layer. Its precise location may not be physical but functional: the boundary separates what is required for proper device functioning (active layers) from what is not required for device operation (transition layers).

The epilayer structure of a typical AlGaN/GaN HEMT shown in FIG. 1 (Prior Art) includes multiplicity of epilayers 9 disposed on top of a native substrate 1. The epilayers 9 are divided into two functional parts: the transition layers 8 and active layers 7. The transition layers 8 comprise of at least one layer, but typically a multiplicity of binary and ternary compound semiconductor epitaxial layers 2 that are grown directly on top of the native substrate 1, often referred to as nucleation layers, that are then followed by a buffer layer 3. The quality of the epilayers grown on the native substrate 1 improves as the growth progresses and at some thickness indicated with dashed line 17, the crystal quality (defect density) of the buffer 3 becomes sufficient for high-crystal quality growth of the active layer 7. The active layer 7 comprises multiple epitaxial layers whose number, thickness, and material choices are designed and optimized to perform specific functions of the electronic or optical device. The growth of the active layer 7 will start at and/or include growing a part of the buffer 3. The reason the active layer functionally includes a part of the buffer layer is because the 2DEG at a heterojunction extends into both the large and lower bandgap materials, and hence it is present in the GaN (as the lower bandgap material, namely, at top of the buffer). Furthermore, the active layer may include may include other features, such as, as the back barrier which would make it extend into the buffer.

It is essential to note that apart from providing a template for growth of the active layer, the transition layers generally do not serve a function in the device operation. From the point of thermal management, the presence of the nucleation layer 2 (part of the transition layer) is detrimental to device thermal performance. Namely, due to multiple layer-boundaries within the transition layer, alloy scattering, and dislocations, the transition layer generally presents a significant barrier to heat flow perpendicular to the layers and thereby limits the device thermal conductance.

The active layers 7 will typically comprise a barrier layer 6 on top of a layer structure 4 that may include a below-channel barrier (not shown) to reduce drain-induced barrier lowering as is well known in the art. The barrier layer 6 may furthermore include a several nanometer thick layer of GaN on top of the barrier layer 6 and/or an MN interlayer below the barrier layer 6 to improve the electron mobility in the two-dimensional electron gas 2DEG 5 as is also known in the art. The active layers 7 may comprise multiple layers of AlGaN or InGaN semiconductor alloys or GaN, AlN, InN or any other related material to realize the desired electrical performance of the HEMT. The buffer is needed to electrically separate the transition layers from the electron gas 5 and its thickness may be increased to improve the device breakdown voltage. The exemplary HEMT shown in FIG. 1 will also feature contacts to the transistor denoted with 10 (source), 11 (gate), and 13 (drain). The source 10 and the drain 13 contacts will typically make ohmic contacts to the active layers 7, while the gate 11 may make a Schottky contact to the active layer 7. Additionally, individual HEMTs may be isolated from adjacent devices on the same wafer or chip using isolation trenches 12 or implantation (not shown) to form monolithically integrated circuits on the same chip. The operation of this transistor and device enhancements described above have been described in publicly available literature, such as, books by Rüdiger Quay titled "Gallium Nitride Electronics", and Umesh K. Mishra and J. Singh titled "Semiconductor Device Physics and Design", both books published by Springer in 2008.

GaN-based HEMTs are used for numerous high power applications owing to the high density of electrons in the 2DEG in GaN and the high-breakdown field which lead to high operating currents and voltages, higher than GaAs devices of similar geometry. The dominant heat generation in high-electron mobility transistors occurs in an area between the gate and the drain 15, close to the device surface. In this area, the energy of electrons accelerated with the high drain potential are first converted into optical phonons by electron-phonon scattering and then by phonon-phonon scattering into acoustic phonons which carry heat (heat conduction). Conventionally, the HEMT shown in FIG. 1 is mounted with the back of the substrate 1 down onto a heat sink: The back metallization 16 is attached to a heat sink (not shown in FIG. 1). The heat generated in the active layers of the transistor has to diffuse to the backside of the wafer and be carried away through the backside 16 by the heatsink and dissipated in the ambient. The temperature rise of the active layer relative to the ambient temperature for a given power dissipated by the device is referred to as the thermal resistance and is an essential design parameter for all electronic devices as the active layer temperature determines the device performance and its reliability. It is the objective high-power electronic and optoelectronic design is to minimize the thermal resistance of any device and thereby improve their reliability and performance over temperature.

Thermal resistance of commercial HEMTs with exemplary structure shown in FIG. 1 is dominated by the relatively low thermal conductivity of the layers in the immediate proximity of the active layer, namely, the thermal conductivity of the active layers 7 and the transition layers 8. More specifically, the nucleation layers 2 which are a part of transition layers 8 may comprise ternary compound semiconductor alloys which exhibit low thermal conductivity. Finally, materials used commercially for the substrate 1 have low thermal resistance further contributing to the overall low thermal resistance of the devices (eg. sapphire, silicon). The result of these materials and structure limitations is that conventional AlGaN/GaN field-effect transistors are limited thermally, but could be made better if its the thermal resistance could be somehow reduced. In summary, the transition layers and the substrate thermal properties are liming the performance of the devices.

There is a need in the industry to improve the thermal performance of AlGaN/GaN HEMTs and similar high-power electronic and optoelectronic devices. This need has spurred a number of investigations in integrating wide-bandgap device active materials with highly thermally conductive substrates by wafer bonding and/or direct growth of wide-gap materials.

Related art references include U.S. Pat. No. 5,650,639 by Schrantz, et al., disclosing bonding of epitaxial layers with diamond substrates for the purpose for improving thermal performance; U.S. Pat. No. 7,033,912 Saxler teaching growing diamond on thinned silicon carbide substrates and optionally growing active layers on this structure; U.S. Pat. No. 6,794,276 Letertre, et al. teaching creation of new substrates for semiconductor devices; and U.S. Pat. No. 7,358,152 by Kub and Hobart disclosing a number of methods to improve the heat conductance of electronic devices, specifically, GaN HEMTs, using wafer bonding of either completed devices or blank GaN epiwafers to highly thermally conductive substrates, synthetic diamond included.

SUMMARY OF THE INVENTION

This application discloses a method for integrating GaN and CVD diamond to form GaN-on-diamond engineered wafers or substrates on which electronic or optoelectronic devices can be manufactured using standard semiconductor processing technology. The disclosed process for manufacturing engineered GaN-on-diamond wafers is described as applied to high-electron mobility transistors. However, the inventions disclosed herein may be implemented using other electronics and optoelectronic devices, such as, bipolar transistors, Schottky diodes, microwave diodes, semiconductor lasers, light-emitting diodes, and super-luminescent diodes without departing from the spirit of the invention.

This invention relates to manufacturing of wide-gap compound-semiconductor-on-diamond composite substrates in which a diamond layer is grown upon a dielectric layer disposed on top of wide-gap compound-semiconductor layers. More specifically, this invention discloses methods and apparatuses for manufacturing of gallium-nitride-on-diamond engineered wafers. This invention furthermore relates to thermal management of high power microwave transistors, high-voltage field-effect transistors and Schottky diodes.

The objective is to improve GaN-based electronic devices to reach lower thermal resistance. This application discloses a number of preferred methods for manufacture of wafers and devices and discloses a number of preferred wafer and device structures that include epilayer structures and device configurations that result in the above-mentioned improvements. Any one of presented methods and embodiments may be used by themselves and in combination with other disclosed embodiments to achieve an improvement in performance.

Terminology

Wide-gap semiconductor technology refers to electronic and optoelectronic device and manufacturing technology based on wide-gap semiconductors.

Wide-gap semiconductor means (a) semiconductors comprising a bond between nitrogen (N) and at least one Group III element from the Periodic Table of the Elements (boron, aluminum, gallium, indium, and thallium), and (b) semiconductors comprising a bond between carbon (C) and at least one Group IV element from the Periodic Table of the Elements (carbon, silicon, germanium, tin, and lead). In this application, wide-gap means but is not limited to gallium nitride (GaN), aluminum nitride (AlN), indium nitride (InN), aluminum gallium nitride (AlGaN), indium gallium nitride (InGaN), aluminum indium nitride (AlInN), silicon carbide (SiC), and diamond (C). The mentioned materials (a) or (b) are single-crystal.

Single-crystal material, wafer or layer means being of one crystal, namely, having a translational symmetry. This term is common for crystal growth, and is a requirement for most semiconductors used in electronics. Real semiconductors have defects, but the defect densities are sufficiently low that assuming translational symmetry is sufficient to explain dominant electronic and optical properties of these materials.

Polycrystalline material means consisting of crystals variously oriented or composed of more than one crystal.

Amorphous material means a material having no real or apparent crystalline form.

Synthetic material means man-made material produced artificially, i.e. not natural, while synthetic diamond means man-made diamond.

Synthetic diamond is man-made diamond produced by any one of methods known in the art including, but not limited to high-temperature high-pressure technique and chemical vapor deposition (CVD).

CVD diamond includes, but is not limited to hot-filament, microwave plasma, and high-voltage arc chemical vapor deposition processes.

Bonding or wafer bonding is a technology in which two surfaces, commonly semiconductor surfaces, are brought into proximity and are caused to adhere firmly. The bonding can be achieved by a chemical bonding or using an adhesive. This process is commonly used in the semiconductor technology. See for example the book by Tong and Gosele: Semiconductor Wafer Bonding, Springer Verlag, 1989.

Wafer bow is the difference between the maximum and minimum height of any point on a wafer when it is laid on a flat surface as shown in FIG. 2 and the height is measured in a direction perpendicular to the flat surface. The surface facing up is the surface being measured.

Native substrate is the substrate on top of which working epilayers are grown. For example, when GaN is grown on sapphire, sapphire is the native substrate. When GaN is grown on GaN substrate, the native substrate is GaN.

In situ means in natural position or place. In the semiconductor industry it generally means performing a special task during an otherwise essential process where the task is not essential to the process nor is it usually done at the same time. A typical use of this term is to describe, for example, optical monitoring or epitaxial or thin film growth during the growth/deposition. In that case one speaks of in-situ optical monitoring. In another example (and also used in the context of this application), passivation layers are usually added to the surface of field-effect transistors after the epitaxial layers have been grown and the wafers have been taken out of the growth chamber. Recently, there has been development in which silicon nitride passivation layer has been deposited on top of the epilayers while in the same growth chamber. In this case one speaks of in-situ silicon nitride passivation. Examples of in-situ silicon nitride passivation are reported in the following publications: "In situ SiN passivation of AlGaN/GaN HEMTs by molecular beam epitaxy", Electronics Letters, Vol. 48, No. 14, pages 779-780, and "Surface Stabilization for Higher Performance AlGaN/GaN HEMT with in-situ MOVPE SiN", MRS Proceedings, Vol. 831, E6.7, 2004.

Non-polar or semi-polar gallium nitride. The c-plane of hexagonal gallium nitride is the most common plane on which gallium nitride is grown. This surface is polar and the resulting heterojunctions contain fixed charge distributions at every interface between different gallium-nitride-related alloys. Gallium nitride can also be grown on a number of other crystallographic planes which result in reduced or no interface charges. These planes are referred to as semi-polar or non-polar planes.

Transition layers are epitaxial layers grown on top of a native substrate 1 of semiconductor $S_1$ with lattice constant $x_1$ and lattice structure $L_1$ in order to enable growth of a quality semiconductor $S_2$ with lattice constant $x_2$ and lattice structure $L_2$ on top of the native substrate 1, wherein $x_1$ and $x_2$ differ sufficiently to prevent low dislocation-density growth of $S_2$ directly on $S_1$, as is well known in the art. The lattice structure $L_1$ and $L_2$ may or may not be different. For example, $L_1$ may be a face-centered cubic, while $L_2$ may be hexagonal, or both $L_1$ and $L_2$ may be cubic. The requirement on how low the dislocation density has to be is determined by the type of the electronic or optoelectronic device to be fabricated and its performance. The exact structure of the transition layers differs from manufacturer to manufacturer, and for the purposes of this application, transition layers refer to any and all layers required to reach the desired defect/dislocation density so that on top of the transition layers an active layer structure can be grown. For the purposes of this application, the transition layers include nucleation layers (multiplicity of ternary and/or binary layers) and a part of a binary buffer layer.

Wafer or Wafers, a typically round plate of made out of semiconductor on top of which electronic or optoelectronic devices are or will be fabricated.

Engineered wafer is a wafer that includes a multiplicity of layers which are manufactured prior to joining them to make the wafer.

Means for vacuum chamber evacuation include mechanical pumps, turbo-molecular pumps, and any other pumps used in conjunction with drawing vacuum in vacuum chambers as is known in the art.

Means for maintaining chuck temperature include capacitive cooling of the wafer that may include liquid cooling and controlling the chuck temperature by adjusting liquid temperature and liquid flow as is well known in the art.

Means for monitoring chuck temperature include pyrometer, thermocouple, or open loop control. Open loop control means operating the chuck at powers that are known from calibration study to result in certain chuck temperature.

Refractory metals are a class of metals that are extraordinarily resistant to heat and wear. The most common definition of refractory metals includes niobium, molybdenum, tantalum, tungsten, and rhenium. They all have melting points above 2000° C.

DETAILED DESCRIPTION OF THE INVENTION

Figure 1:
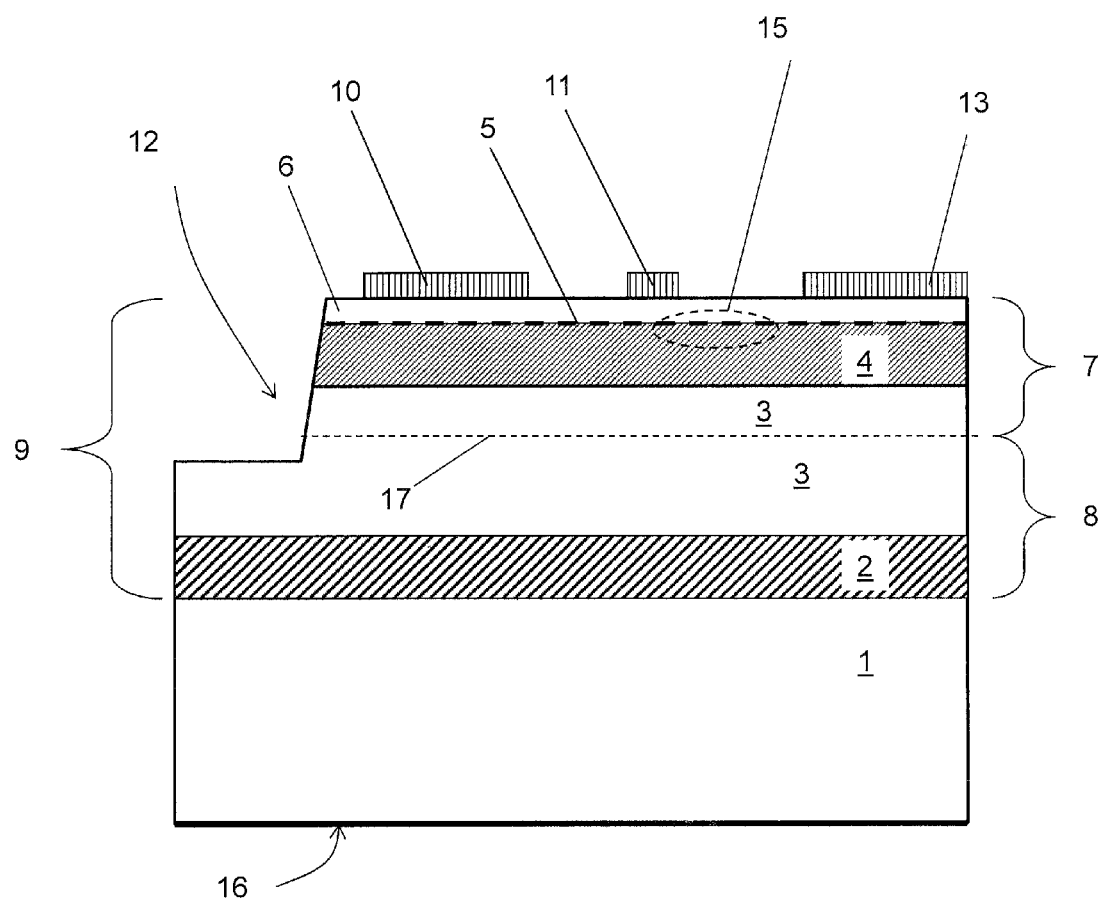
FIG. 1 shows prior art high-electron mobility transistor epilayer structure.
Figure 2:
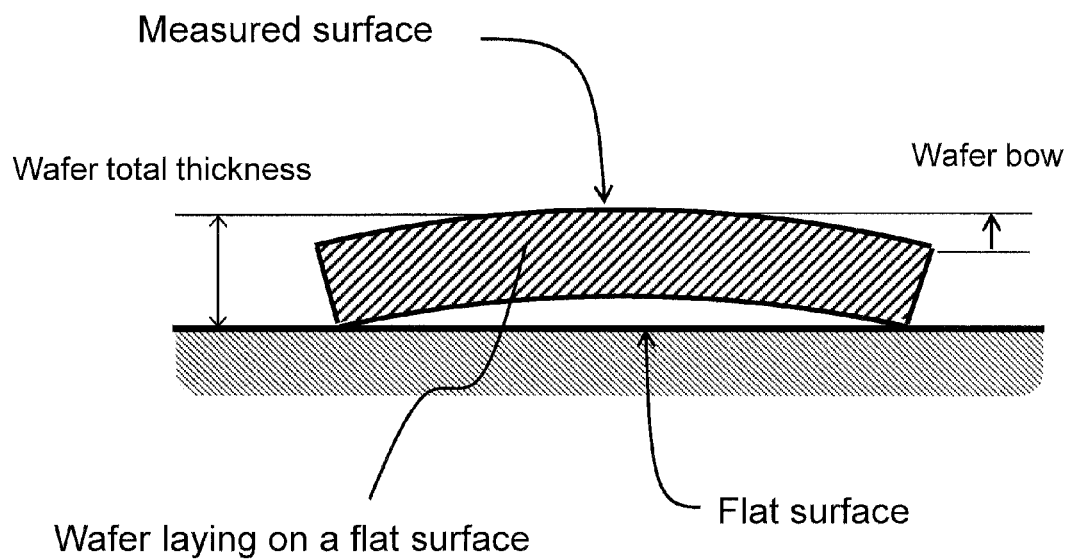
FIG. 2 illustrates the definition of bow measurement.
Figure 3:
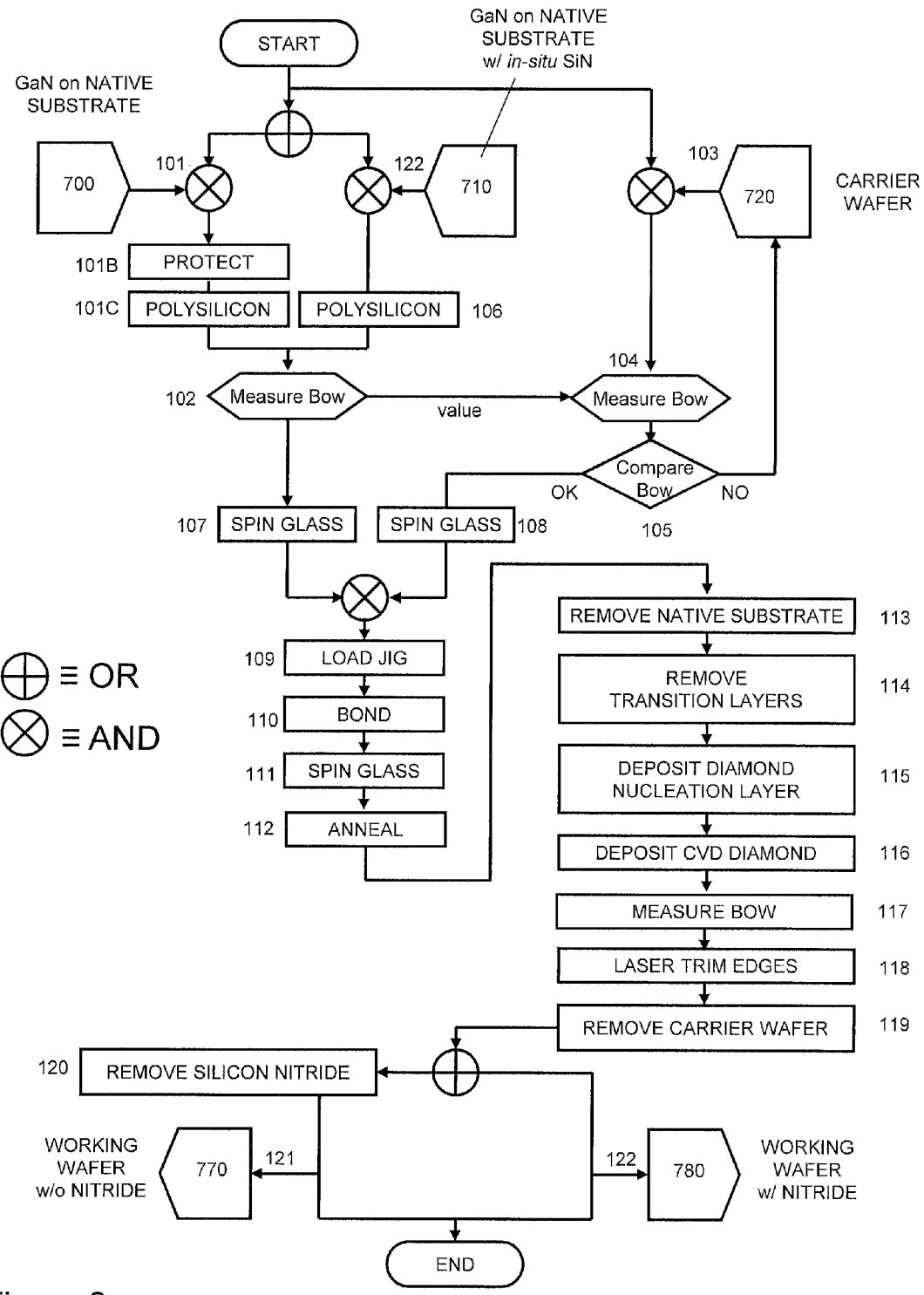
FIG. 3 is a block diagram illustrating a preferred method for manufacturing GaN-on-diamond engineered wafers.

Preferred methods 100 and 200 are explained with the help of a block diagram in FIG. 3 and other figures that are used to clarify the structure of wafers used or produced by the preferred processes. In Method 100, the wafers provided are "GaN on NATIVE SUBSTRATE" 700 having structure illustratively shown in FIG. 4A and "CARRIER WAFER" 720 having structure illustratively shown in FIG. 4B. In Method 200, the wafers provided are "GaN on NATIVE SUBSTRATE with in-situ silicon nitride" 710 having structure illustratively shown in FIG. 12 and "CARRIER WAFER" 720 having structure illustratively shown in FIG. 4B. The methods merge before step 102 and continue with the same steps for either method. Either method can be used to produce an engineered GaN-on-diamond wafer with silicon nitride coating 780 ("WORKING WAFER w/NITRIDE"). Either method can be used to produce an engineered GaN-on-diamond wafer without silicon nitride coating 770 ("WORKING WAFER w/o NITRIDE") as illustrated in the flow chart in FIG. 3. In other words, in either method 100 or 200, the removal of silicon nitride in step 120 is optional. The choice between the method is determined by the availability of the type of GaN on native substrates: either in-situ silicon nitride or without. The choice is that of the manufacturer of engineered wafers and/or the manufacturer of the devices using the product of the methods.

The order of the process steps is given by the order in which the specification is written and the block diagram shown in FIG. 3.

Method 100

Figure 4A:
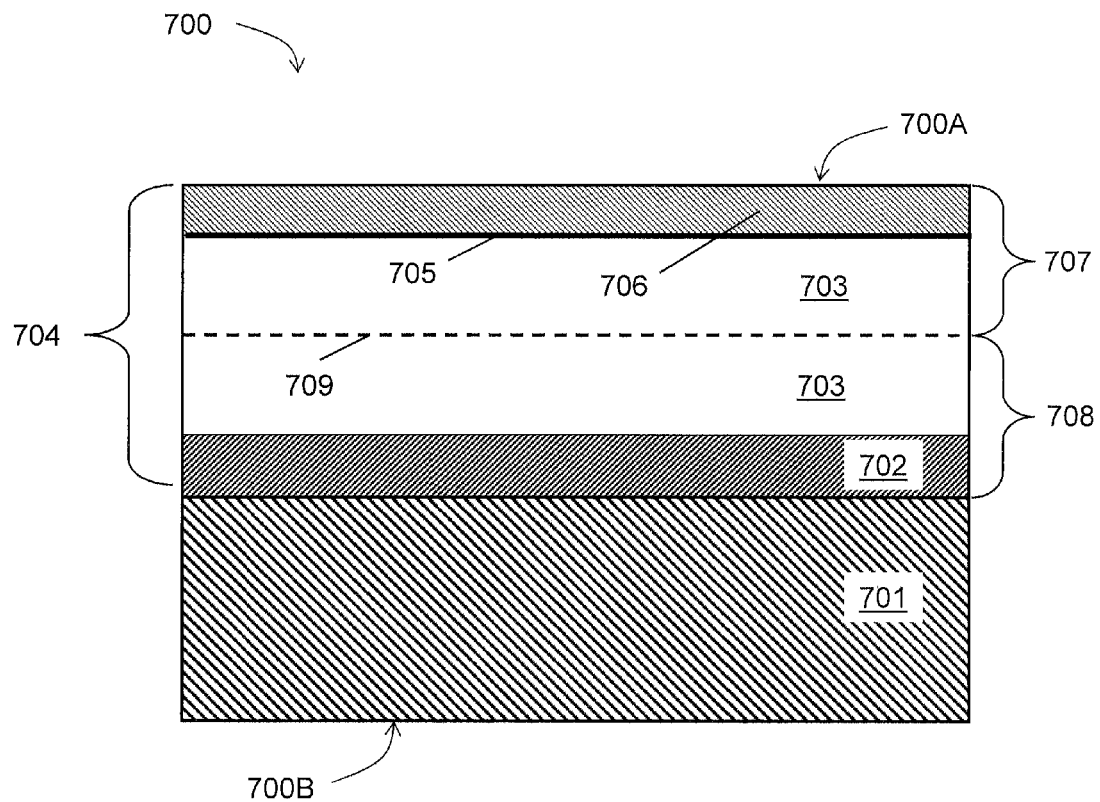
FIG. 4 shows (a) an illustration of the parts of wafer 700 and (b) carrier wafer 720.
Figure 4B:
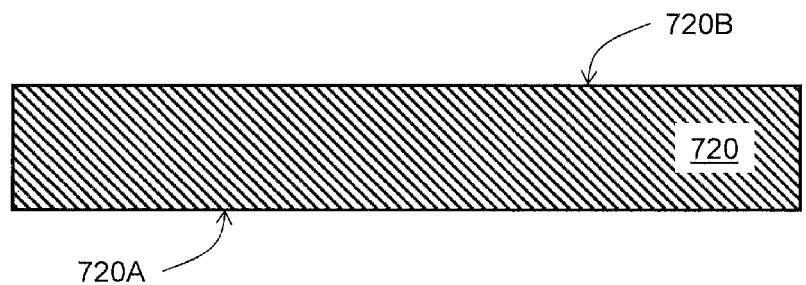

STEP 101 "PROVIDE GAN ON NATIVE SUBSTRATE": In method 100, an epi-wafer 700 is provided in step 101, wherein epi-wafer 700 comprises a native substrate and GaN epilayers disposed on top of the native substrate. Structure of wafer 700 is illustrated in FIG. 4A. The wafer 700 comprises epilayers 704 grown on a native substrate 701. The epilayers 704 comprise transition layers 708 disposed on top of a native substrate 701 and active layers 707 disposed on top of the transition layers 708. The active layers 707 comprise a barrier layer 706, a two-dimensional electron gas 705, and may optionally include a back barrier (not shown in FIG. 4A) and an optional AlN interfacial layer (not shown in FIG. 4A) as is known in the art to improve the performance of RF high-electron mobility transistors. The materials included in the active layer include but are not limited to any binary, ternary, quaternary alloy involving Ga, Al, In, B, and N atoms. In one embodiment, the active layer comprises at least one layer with polar gallium nitride and gallium-terminated surface of the active layer is proximal to surface 700A. In one embodiment, the active layer comprises polar gallium nitride with gallium-terminated surface of the active layer proximal to surface 700A. The transition layers 708 comprise of nucleation layers 702 adjacent to the native substrate 701 and at least a part of buffer layer 703 disposed on top of the nucleation layers 702. The buffer layer 703 is preferably made out of GaN. A functional boundary 709 between the active layers 707 and the transition layers 708 appears within or at the edge of the buffer 703. In one embodiment, the wafer structure 700 represents an AlGaN/GaN HEMT as is known in the art and the active layers are grown on the Ga-face GaN. In one embodiment of present invention, the native substrate 701 is made out of silicon. It is clear that native substrate 701 may also be made out of silicon carbide, sapphire, and aluminum nitride without departing from the spirit of the invention. In one embodiment of the present invention, wafers with preferred design 700, but not limited to design 700, are provided as starting material to process 100.

The top surface of epi-wafer 700 is referred to as surface 700A, while the bottom surface of the epi-wafer 700 is referred to as surface 700B.

STEP 101B "PROTECT": The top surface 700A of wafer 700 is coated with a layer 804 comprising silicon nitride, deposited on top of surface 700A. The silicon nitride layer is preferably deposited using thermal chemical-vapor deposition. The thickness of silicon nitride layer is preferably 50 nm, but thicker or thinner films can be used without departing from the spirit of the invention. For example, the thicknesses of the silicon nitride that have been experimentally confirmed to work range between 20 nm and 200 nm. The top surface of the coated wafer 700 is now referred to as surface 804A.

STEP 101C "POLYSILICON": The top surface 700A of wafer 700 is coated with a layer of polysilicon 805 deposited on top of silicon nitride surface 804A. The thickness of the polysilicon layer 805 is preferably 1000 nm, but thicknesses between 100 nm and 2000 nm are possible. The polysilicon layer 805 is deposited using thermal chemical-vapor deposition at 600° C. In one embodiment, POLYSILICON step follows the PROTECT step in-situ, without removing the wafer from the process chamber. The top surface of the coated wafer 700 is now referred to as surface 805A.

Method 200

Figure 12:
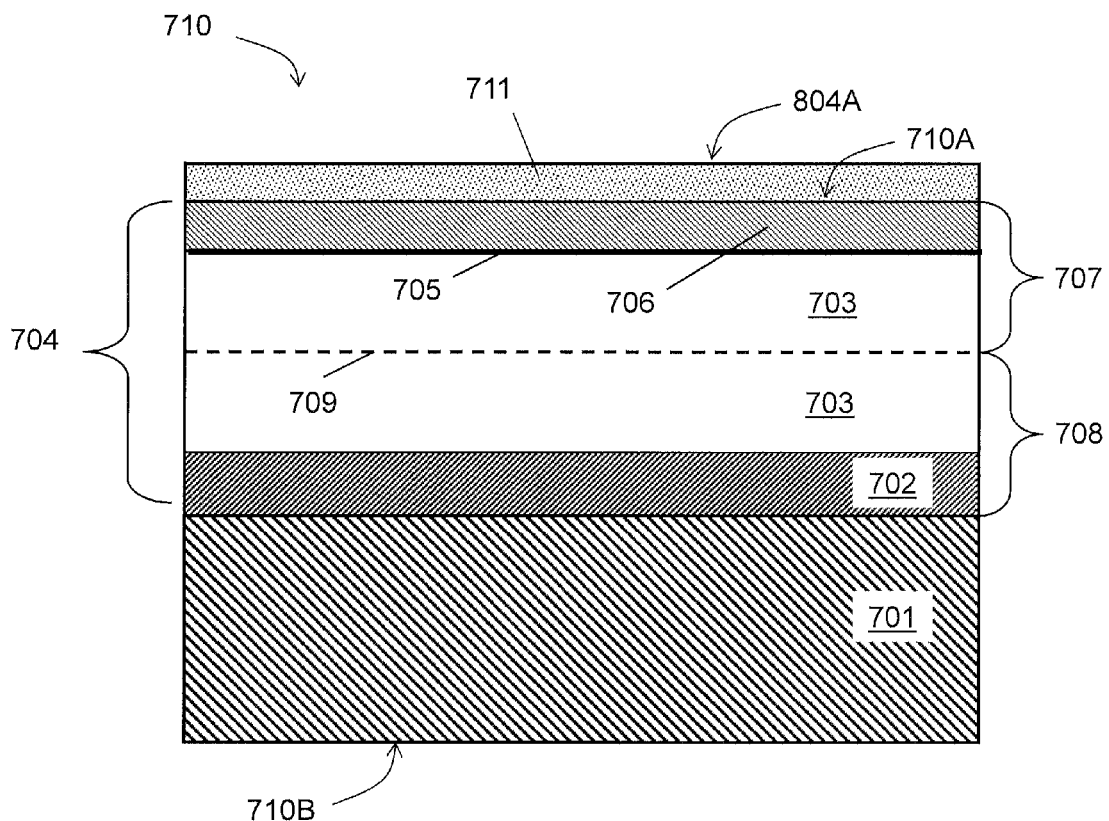
FIG. 12 illustrates the parts of wafer 710, gallium nitride epilayers with in-situ silicon nitride.

STEP 101 "PROVIDE GAN ON NATIVE SUBSTRATE w/in-situ SiN": In method 200, an epi-wafer 710 is provided in step 122, wherein epi-wafer 710 comprises a native substrate, GaN epilayers disposed on top of the native substrate, and an in-situ deposited silicon nitride layer on top of the GaN epilayers. An exemplary structure of wafer 710 is illustrated in FIG. 12. The numbering on the layers comprising wafer 710 that have the same function as the corresponding layers in the structure 700 are kept identical to those in wafer 700. It is clear to a person skilled in the art that the specific epilayer design used for wafer 700 (layer thicknesses, composition, and number of layers) may differ from wafer 710 without departing from the spirit of the invention. The wafer 710 comprises of epilayers 704 grown on a native substrate 701 and a silicon nitride layer 711 grown in-situ on top of the epilayers 704. The epilayers 704 comprise transition layers 708 disposed on top of a native substrate 701 and active layers 707 disposed on top of the transition layers 708. The active layers 707 comprise a barrier layer 706, a two-dimensional electron gas 705, and may optionally include a back barrier (not shown in FIG. 12) and an optional AlN interfacial layer (not shown in FIG. 12) as is known in the art to improve the performance of RF high-electron mobility transistors. The materials included in the active layer include but are not limited to any binary, ternary, quaternary alloy involving Ga, Al, In, B, and N atoms. In one embodiment, the active layer comprises at least one layer with polar gallium nitride and gallium-terminated surface of the active layer is proximal to surface 804A. In another embodiment, the crystal orientation of said active layers 707 may be one of polar, semi-polar, or non-polar. The transition layers 708 comprise of nucleation layers 702 adjacent to the native substrate 701 and at least a part of buffer layer 703 disposed on top of the nucleation layers 702. The buffer layer 703 is preferably made out of GaN. A functional boundary 709 between the active layers 707 and the transition layers 708 appears within or at an edge of the buffer 703. In one embodiment, the wafer structure 710 represents an AlGaN/GaN HEMT as is known in the art and the active layers are grown on the Ga-face GaN. In one embodiment of present invention, the native substrate 701 is made out of silicon. It is clear that native substrate 701 may also be made out of silicon carbide, sapphire, and aluminum nitride without departing from the spirit of the invention. In one embodiment of the present invention, wafers with preferred design 710, but not limited to design 710, are provided as starting material to Method 200. The top surface of wafer 710 is referred to as surface 804A, while the bottom surface of the epi-wafer 710 is referred to as surface 710B

STEP 106 "POLYSILICON": The top surface 700A of wafer 700 is coated with a layer of polysilicon 805 deposited on top of silicon nitride surface 804A. The thickness of the polysilicon layer 805 is preferably 1000 nm, but thicknesses between 100 nm and 2000 nm are possible. The polysilicon layer 805 is deposited using thermal chemical-vapor deposition at 600° C. The top surface of the coated wafer 700 is now referred to as surface 805A.

Steps Common to Methods 100 and 200

In further text, the preferred method for manufacturing GaN/diamond engineered wafers is described using the wafer 700 as starting material (Method 100). If Method 200 is practiced, wafer 700 and the associated surfaces 700A and 700B are to be replaced with wafer 710 and the associated surfaces by 710A and 710B, respectively. It is also clear that the surfaces 804A and 805A mean the surface of silicon nitride layer 804 when Method 100 is practiced, and that the surface 804A means the surface of in-situ silicon nitride layer 711 when Method 200 is practiced, and that in either case the 805A surface is that of polysilicon layer deposited in steps 101C if Method 100 is used or 106 if Method 200 is used.

STEP 102 "MEASURE BOW": Bow of wafer 700 with surface 700A up is measured using a surface-profilometer or micrometer. The recorded value of bow is referred to as the first bow value. The typical values of first bow on a 100-mm wafer are negative between −4 μm and −12 μm.

STEP 103 "CARRIER WAFER": A carrier wafer 720 is selected (shown in FIG. 4B). In one embodiment, the wafer 720 is a silicon wafer with crystalline orientation (100) or (110). At least one side of wafer 720 is polished. The polished side of wafer 720 is referred to as surface 720B, and the other side is referred to as surface 720A.

STEP 104 "MEASURE BOW": The bow of carrier wafer 720 is measured on surface 720B and the value of bow is referred to as the second bow value. The typical values of second bow on carrier wafer 720 range between 0 and +10 μm.

STEP 105 "COMPARE BOW": The first and second bow values are compared with the purpose of finding an appropriate carrier wafer 720 that will be bonded to the wafer 700 in a later step. The following two conditions have to be met simultaneously for accepting a match between wafers 700 and 720:

(a) Either the first bow value is positive and the second bow value is zero or negative, or the second value of bow is negative and the first bow value is zero or positive, and (b) The absolute difference between first and second bow values is less or equal to 10 μm multiplied by the square of the ratio of the wafer diameter in mm divided by 100 mm. Expressed mathematically, $|BOW_1 - BOW_2| \leq 10$ μm·$(D/100)^2$, where $BOW_1$ is the first bow value, $BOW_2$ the second bow value, and D the wafer diameter in millimeters. If both (a) and (b) are met, the wafer 720 is used with wafer 700 and one proceeds with wafer 720 to step 108. If less than both of these two conditions are met, one selects a new carrier wafer 720 in step 103 and the steps 104 and 105 repeat until the bow condition is met and the selected carrier wafer 720 can be used in step 108.

Figure 5A:
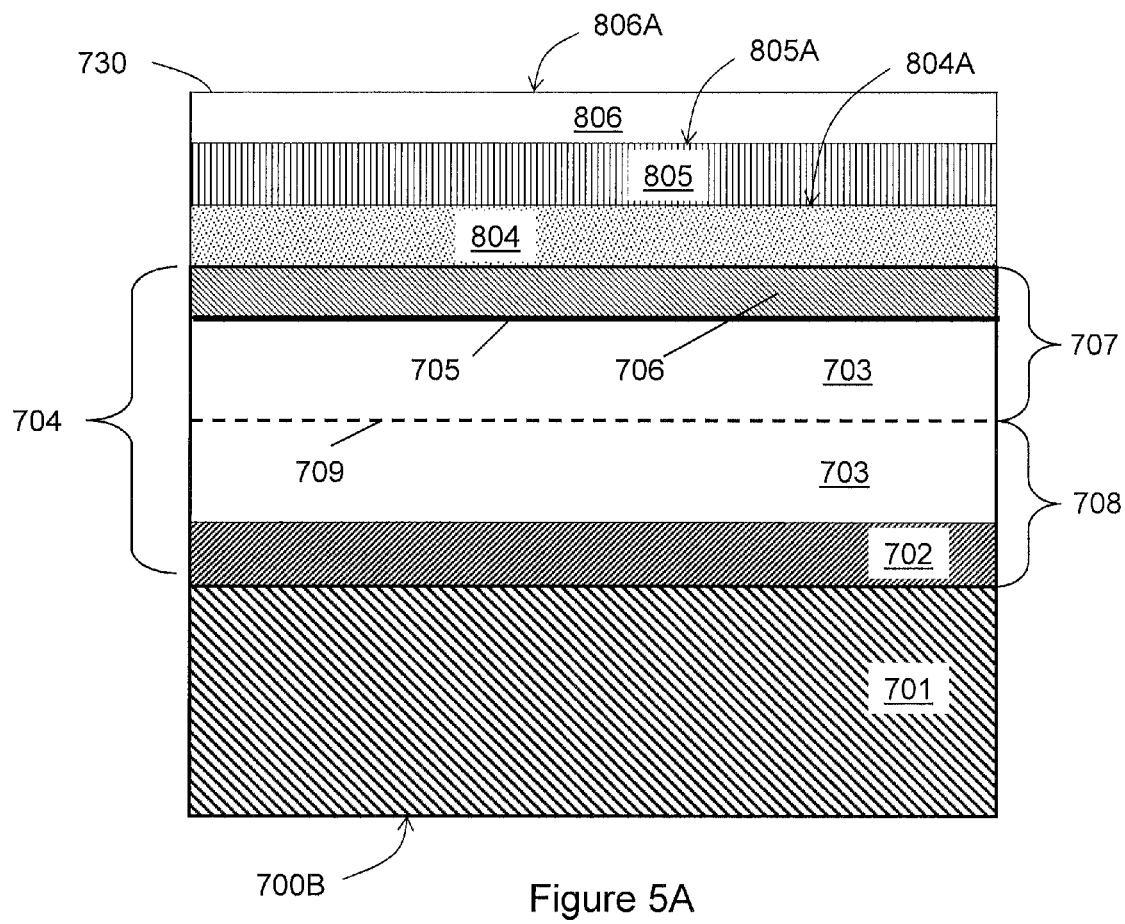
FIG. 5 shows (a) an illustration of the parts of wafer 730 and (b) carrier wafer 740.
Figure 5B:
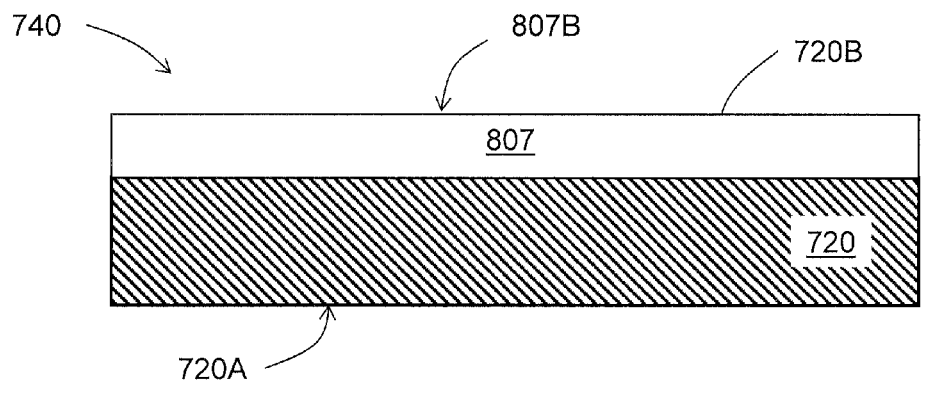

STEPS 107 and 108 "SPIN GLASS": In step 107, the surface 805A of wafer 700 is spin-coated with a glass 806 and in step 108 surface 720A of wafer 720 is spin-coated with same glass (numbered 807) and under same process conditions. Once coated, wafer 700 is referred to as wafer 730 as shown in FIG. 5A, and wafer 720 is referred to as wafer 740 as shown in FIG. 5B. The coating process conditions and recipe is described next. These two steps (step 107 and 108) may occur sequentially or simultaneously. The glass used in layers 806 and 807 has the following preferred characteristics: (a) it has a melting point or processing temperature at 1000° C. or within 10% of 1000° C., and (b) linear coefficient of thermal expansion (CTE) between 3 ppm/K and 6 ppm/K at room temperature. These specifications have been shown to be necessary for flat adhesion of wafers in later step 110. An example of such a glass proven to work with the preferred process is Ferro Metal Sealing glass EG2800 manufactured by Ferro Corporation, Mayfield Heights, Ohio. Coating both wafers 700 and 720 with said glass using a conventional semiconductor-foundry-type spinner at 4,000 rpm for 15 seconds results in glass thickness of 3 µm. The glass-coated wafers 730 and 740 are then dried on a hotplate at 120° C. for 5 min, then the wafer backsides (720A and 700B) are cleaned from any excess glass, and another hotplate at 400° C. for 5 min is applied. Both wafers 730 and 740 are finally baked in a furnace at 750° C. for 30 minutes to dry out. The glass-coated surface of wafer 730 is now referred to as surface 806A, and the glass coated surface of wafer 740 is now referred to as surface 807B. In one embodiment, the total glass thickness (806 plus 807) is between 100 nm and 10 um.

Figure 6:
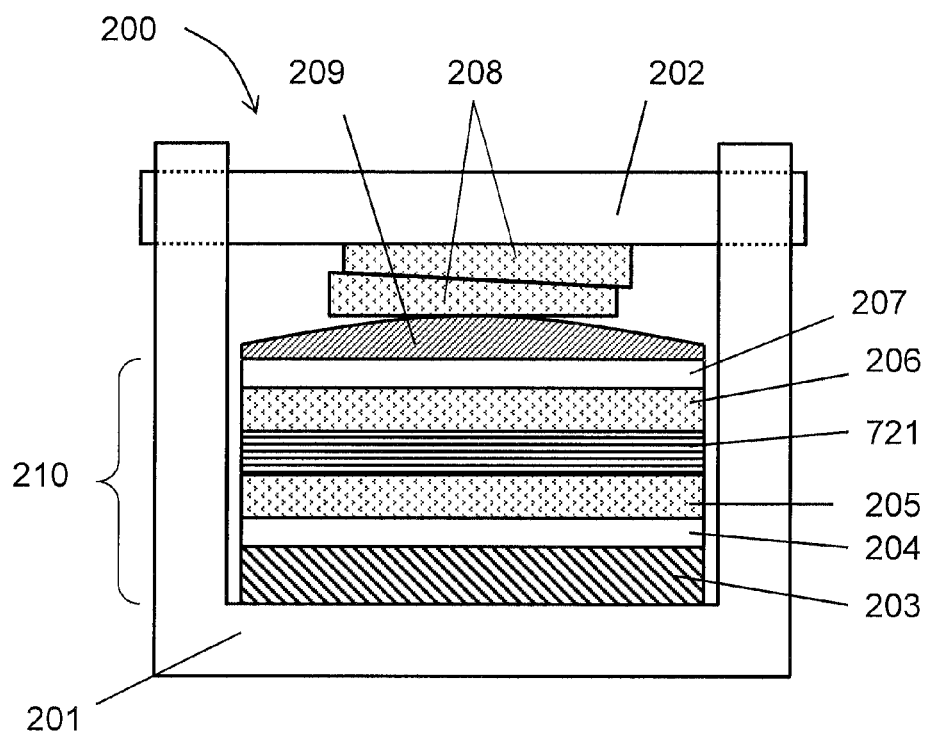
FIG. 6 is an illustration of an exemplary bonding jig used in the process for manufacturing GaN-on-diamond wafers.

STEP 109 "LOAD JIG": Wafers 730 and 740 are placed in contact with the glass-coated surfaces 806A and 807B touching, and bonded under elevated temperature and axial pressure pressing the wafers against each other. In one embodiment, the wafers are placed into a bonding jig which enables pressure to be applied against the wafers 730 and 740 so that they stay pressed against each other during an annealing step. The wafer sandwich containing the wafer 730 on bottom and wafer 740 on top is referred to as wafer sandwich 721 and the two revealed surfaces of this wafer sandwich 721 are surfaces 720A and 700B. A view of an exemplary bonding jig is illustrated in FIG. 6. The relative dimensions in the FIG. 6 are not to scale, the drawing only illustrates the functional elements of the jig necessary for successful completion of preferred process step 109.

The bonding jig 200 comprises at least of a base 201 providing support of the wafers to be bonded, a cross-bar 202 providing pressure from the top on the wafers to be bonded, two-piece angled height adjustment member 208, and a dome 209 which ensures that the pressure on top of the wafers is applied in the center of the wafer and even distributed to the entire surface of the wafers below it.

On the bottom of bonding jig 200, the following elements are placed in order: at least one alumina plate 203, first quartz plate 204, first silicon wafer 205, the wafer sandwich 721 with the surface 700B adjacent to first silicon wafer 205, a second silicon wafer 206, second quartz plate 207, and finally the dome 209 on top of this stack. The listed wafer/plate stack (203, 204, 205, 721, 206, and 207) is referred to as the wafer/plate stack 210. The dome 209 is pressed down with the angled height-adjusting members 208 which are pressing against the cross-bar 202. The jig is so loaded at room temperature and the angled height-adjusting members are positioned in such a way that a slight force is exerted on the dome 209. The cross-bar 202 is coupled to the base 201 in such a way that it resists any movement upwards which is the direction in which the wafers/plate stack 210 will expand when heated. The cross-bar 202 can be easily removed once the angled height adjustment members 208 are moved to release the pressure from the wafer/stack 210. The quartz plates 204 and 207 have an approximate thickness equal to 3 mm each and bow of the surface facing the wafer sandwich 721 less than 8 µm. The total thickness of the alumina plate or plates 203 is approximately 5 mm. The thickness of the first and second silicon wafers is approximately 500 µm each. The diameter of all the wafers and plates is at least as large as the diameter of the wafer sandwich 721.

The principle of operation of the bonding jig is as follows: The jig is loaded at room temperature and the force on the wafer sandwich 721, which is a part of the stack 210, exerted by the jig is set to be small, but sufficient to hold the wafers in place. As the temperature rises, the jig 201 (including the cross-bar 202, the dome 209, and the height-adjusting members) and the loaded wafer/plate stack 210 expand with different rates in such a way the force on the wafer sandwich 721 increases. Alumina and silicon have a larger coefficient of thermal expansion than quartz and hence the wafer/plate stack 210 expand more than dimension allowed for it by the base 201, the cross-bar 202, the dome 209, and the height-adjusting members 208. In this way, at elevated temperature the jig exerts a force pressing the wafer sandwich 721 together and realizes bonding of the wafers 700 and 720 using the spun-on glass layers 806/807 between them. The jig base 201, the cross-bar 202, the two angled height-adjusting members 208, and the dome 209 are all preferably made out of quartz with CTE ~0.6 ppm/K. It is clear that material combination other than alumina or silicon as the high CTE material and quartz as the low CTE material can be used to accomplish the same function without departing from the spirit of the invention.

In another embodiment, the pressure and the elevated temperature profiles are applied independently using a suitable apparatus as is known in the art. In one embodiment, the pressure is applied before and during the elevated temperature process, but released (set to near zero) during the cool down.

STEP 110 "BOND": The jig with the wafer sandwich 721 (as a part of the stack 210) is loaded into a furnace and heated at a heating rate 10° C./min to 1000° C. where is left to soak for 20 min (soak time) before cooling down at a rate approximately equal to the heating rate. The jig is unloaded and wafer sandwich 721 taken out. The preferred value of force the jig 200 exerts onto the wafer sandwich 721 of diameter 100 mm in the jig at 1000° C. is at least 50 N and not more than 150 N. In one embodiment, the soak time ranges between 5 and 30 minutes.

STEP 111 "SPIN GLASS": The edges of wafer sandwich 721 are manually or robotically coated with glass 806 and then the surface 720A of wafer sandwich 721 is spin-coated with glass 806 on a conventional semiconductor-foundry-type spinner at 4,000 rpm for 15 seconds. This results in glass thickness of 3 µm on the surface 720A. The glass-coated wafer 720 is then dried on a hotplate at 120° C. for 5 min, then the wafer surface 700B is cleaned from any excess glass, and another hotplate at 400° C. for 5 min is applied. Wafer sandwich 721 is finally baked in a furnace at 750° C. for 30 minutes to burn-off polymers.

STEP 112 "ANNEAL": Wafer sandwich 721 is loaded into a furnace and heated at a heating rate 10° C./min to 1000° C. where is left to soak for 20 min before cooling down at a rate approximately equal to the heating rate. The jig is unloaded and the wafer sandwich 721 taken out.

STEP 113 "REMOVE NATIVE SUBSTRATE": The wafer sandwich 721 is now subjected to substrate removal step. In one embodiment, the silicon portion 701 of wafer 700 is removed down to the nucleation layers 702 by first performing a mechanical grinding to 100 um remaining thickness of native substrate 701 using a 6 um grit. The surface of silicon 701 that has been thinned is now exposed to 2 minutes of oxygen plasma to clean, and then the rest of the 100 um of silicon is removed using plasma etching in SF6 at 100 mTorr 290 W and 175 V self-bias. Once the silicon layer 701 has been and the etch stops on the nucleation layer 702, the self-bias voltage generally jumps up by several volts. Typical etch rate is 1 μm/min and etch lasts around 90 min. The revealed surface of nucleation layer 702 is cleaned with hot acetone. In one embodiment, the step 114 includes the removal of a part of the buffer layer 703. In another embodiment, the entire native substrate is removed by plasma etching. There is a number of ways, as known in the art, to remove silicon substrates down to an etch stop, any one of which can be applied to this step without departing from the invention.

STEP 114 "REMOVE NUCLEATION LAYERS": In this step, the nucleation layers 708 are removed. In one embodiment, the wafer sandwich 721 is next subjected to a wet chemical etch in hot sulphuric acid at 120° C. with 13 liters of $H_2SO_4$ and 0.2 liters $H_2O_2$. This step removes the AlGaN nucleation layers with typical etch rate 500 nm/hr. At the end of this etch the surface 700B is now GaN buffer layer 703. In one embodiment, step 114 also includes removal of a part of the buffer layer 703, preferably the part of the buffer layer 703 between the nucleation layer 702 and the functional boundary 709 beyond which the material quality is high (defect density low). In one embodiment, the nucleation layers are removed by dry etching. In yet another embodiment, the nucleation layers are removed by a combination of dry and wet chemical etching. The surface of the GaN buffer 703 remaining revealed is referred to as surface 703B.

STEP 115 "DEPOSIT DIAMOND NUCLEATION LAYER": The revealed surface of GaN buffer layer 703B is now coated with thermal silicon nitride 801 at 600° C. in a furnace. The typical growth rate is approximately 5 nm/min and the time is adjusted for desired thickness. The typical thicknesses range from 10 nm to 60 nm. The deposited silicon nitride 801 is amorphous, but may be polycrystalline. The revealed surface of silicon nitride 801 is not referred to as surface 801B, and the wafer at this stage is referred to as wafer sandwich 750.

Figure 7:
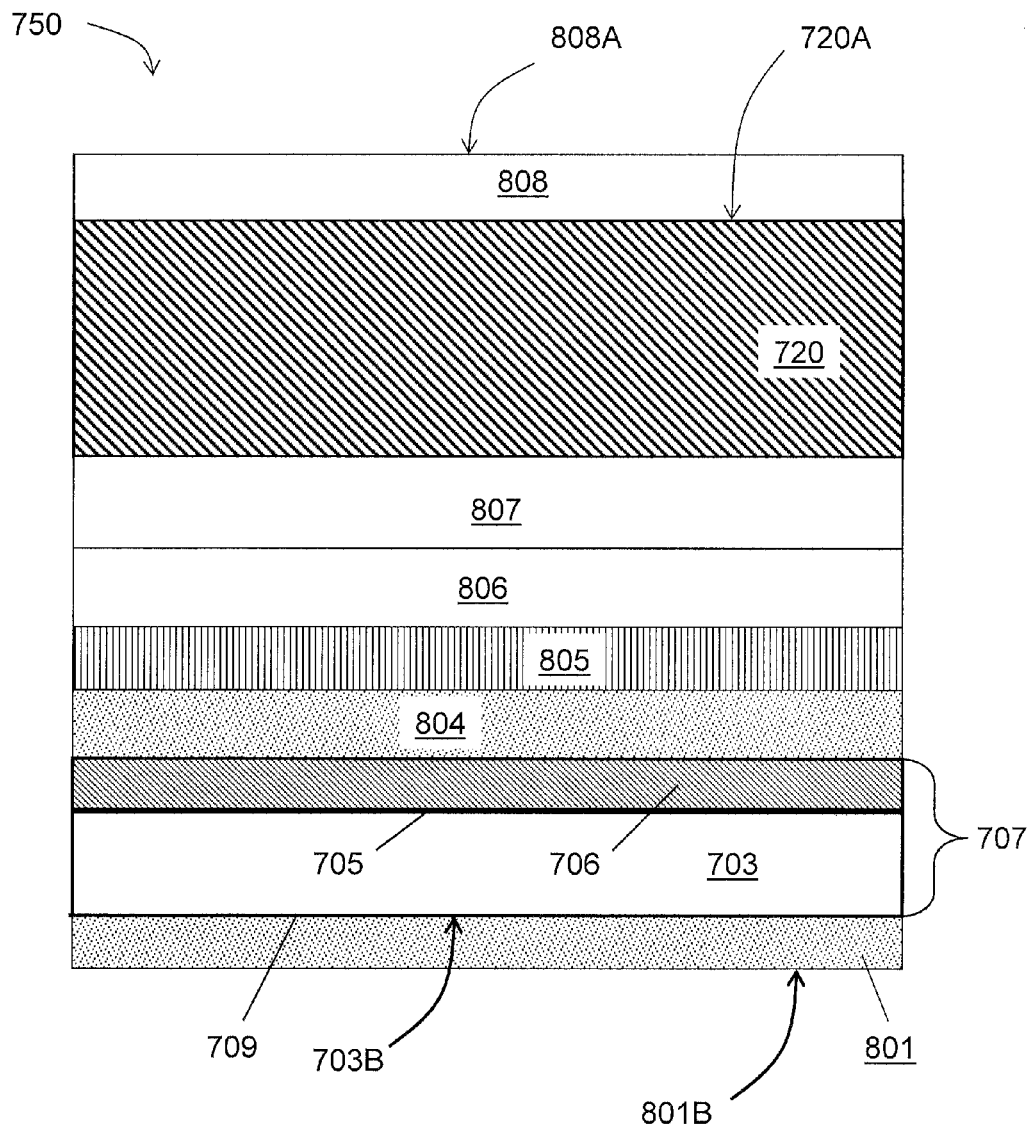
FIG. 7 is an illustration of the elements of wafer sandwich 750 ready for diamond deposition.

At the end of step 115, the structure of wafer sandwich 750 prepared for diamond deposition is shown illustratively in FIG. 7. The wafer sandwich 750 comprises of the following layers: active layers 707 as were present in the original as-grown wafer 700 (see FIG. 4A), a layer of silicon nitride 804 as deposited in step 106 on top of the active layer 707, glass 806 and 807 deposited in steps 107 and 108 on top of polysilicon layer 805, carrier wafer 720 as attached in step 109, and silicon nitride layer 801 on top of the active layer as deposited in step 115. The revealed surface of the silicon nitride layer 801 is referred to as the new surface 801B, and the remaining revealed surface of the glass 808 is still referred to as surface 808A. The structure of the active layer 707 remains the same as in wafer 700: The active layer 707 comprises a GaN buffer layer 703, a two-dimensional electron gas 705, and AlGaN barrier 706.

In one embodiment, a substrate prepared for diamond deposition comprises silicon wafer; a layer of glass disposed on top of said silicon wafer; a poly-silicon layer disposed on top of said glass layer; a first silicon nitride layer disposed on top of said polysilicon layer; a multilayered structure layer comprising at least one layer made out of gallium nitride disposed on top of said polysilicon layer; a second silicon nitride layer with thickness between 10 nm and 100 nm disposed on top of said multilayered structure layer; wherein said second silicon nitride layer is amorphous. In one embodiment, said silicon wafer has thickness greater than 0.2 millimeters. In yet another embodiment, the layer of glass has thickness between 0.1 micrometers and 10 micrometers. In yet another embodiment, the layer of glass has a melting temperature of at least 1000° C. In yet another embodiment, the polysilicon layer has thickness between 0.1 and 2 micrometers. In another embodiment, the first silicon nitride layer is an in-situ silicon nitride. In yet another embodiment, the second silicon nitride layer has thickness between 10 nanometers and 100 nanometers. In yet another embodiment, the at least one gallium nitride layer is semi-polar or non-polar gallium nitride. In yet another embodiment, the multilayered layer has a surface consisting of gallium-terminated gallium nitride, said surface is adjacent to said first silicon nitride.

STEP 116 "DEPOSIT DIAMOND": The 801B surface of the wafer sandwich 750 is prepared for diamond growth. In one embodiment, the surface 801A is first seeded with 100-nm diamond grit by dry scratch for 9 min 50-mm or 14 min for 100-mm wafer using a using diamond-grit-loaded cloth. In another embodiment, the wafers are laid down for scratching using large cloth with applying vibratory seeding. In yet another embodiment, the wafers are wet scratched by using the same grit with ultrasonic bath ethanol, methanol, or isopropanol. The process of seeding a surface for diamond growth is a process well known in diamond growth technology.

The seeded wafer sandwich 750 is now loaded into a diamond growth chamber and a diamond layer is grown on top of the surface 801B by chemical-vapor deposition.

Figure 8:
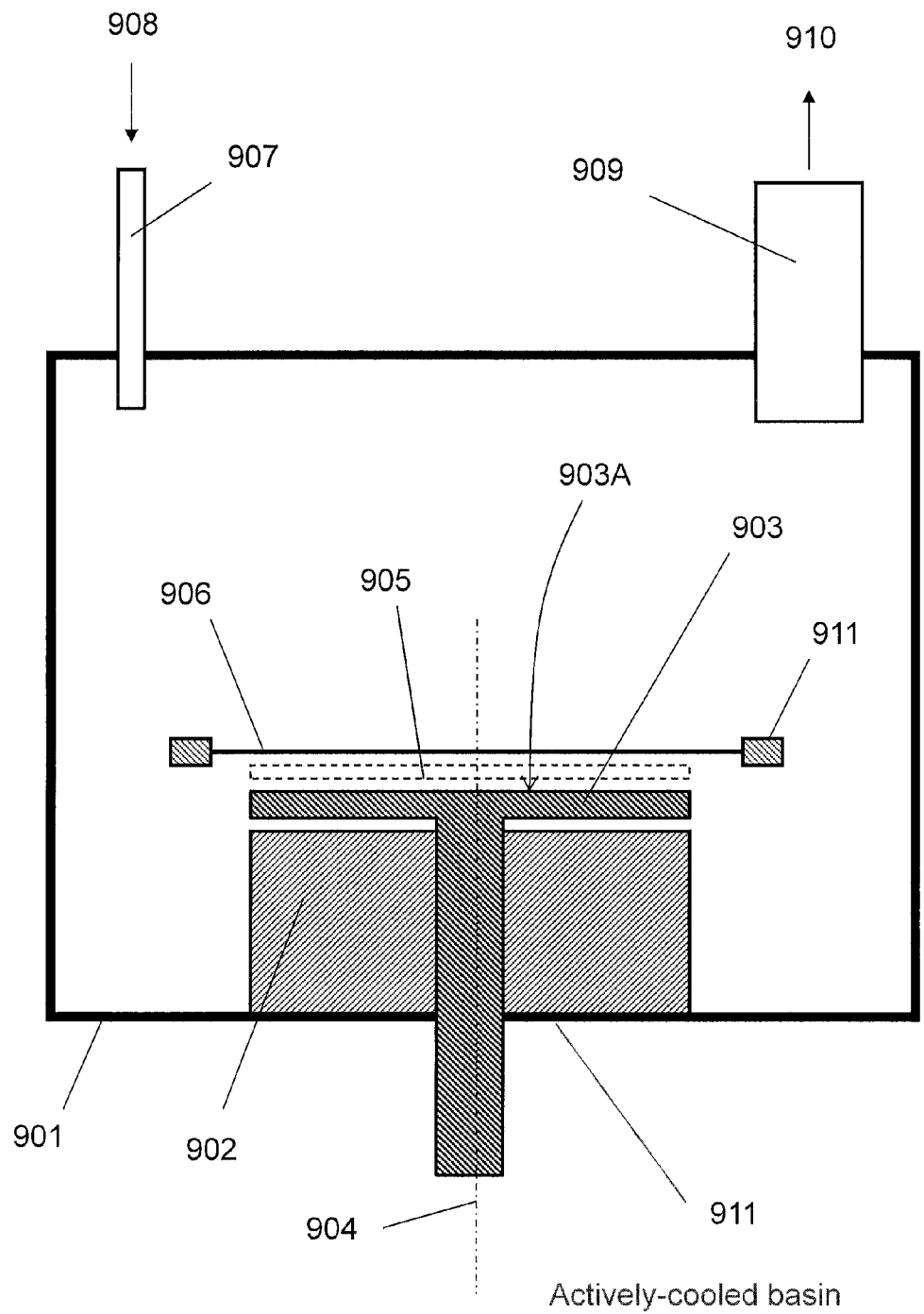
FIG. 8 is an illustration of the elements of diamond growth chamber used in the preferred process for manufacturing GaN-on-diamond engineered wafers.

Illustratively shown in FIG. 8, the CVD diamond chamber comprises of (a) a vacuum chamber 901, (b) a chuck 902 operatively configured to be actively or capacitively temperature controlled on top of an actively-cooled basin 911, (c) a molybdenum disk 903 having a surface 903A for holding a wafer 905 of a diameter, said molybdenum disk 903 disposed between said chuck 902 and said wafer 905, and said molybdenum disk 903 operatively configured to rotate along an axis 904 perpendicular to said wafer 905, and (d) a multiplicity of filaments 906 arranged in a linear one-dimensional array stretched between filament contacts 911 above said molybdenum disk 903, said array of filaments 906 being parallel to said surface 903A, said multiplicity of filaments 903 distanced from said surface 903A by not more than 25 mm. In one embodiment, said multiplicity of filaments 906 is distanced from said wafer surface by not less than 4 mm. Said vacuum chamber 901 is operatively configured using pipes and manifolds 907 as is known in the art to provide reaction gases 908 to the chamber wherein said reaction gases 908 comprise at least one carbon-bearing gas and hydrogen. In one embodiment, said carbon-bearing gas is methane ($CH_4$). The reaction gases may include oxygen. The vacuum chamber 901 is further equipped with a vacuum pump (located at the exit 910 of FIG. 8) and is operatively configured to operate in a pressure range that includes pressures below 100 Torr. The pressure control may be performed by maintaining constant pump speed and adjusting the gas flow or by controlling a flow control value at the exit 909 from the vacuum chamber 901. In one embodiment, the filaments are made out of refractory metal. In yet another embodiment the filaments are made out of tungsten. The chuck is cooled so that the surface of the molybdenum disk is maintained at a temperature at or below 800° C. The walls of the vacuum chamber 901 include water cooling.

The process recipe comprises of steps of (a) loading the wafer into the chamber by placing the wafer sandwich 750 with surface 808A facing the molybdenum disk 903, (b) providing a multiplicity of filaments arranged in a linear one-dimensional array stretched above said wafer sandwich 750 and being parallel to said wafer surface, said multiplicity of filaments distanced from said wafer surface by not less than 4 mm, (c) providing reaction gases to the chamber wherein said reaction gases comprise at least one carbon-bearing gas and hydrogen at flow rates sufficient to adjust the chamber pressure below 100 Torr, (d) providing electrical power to said multiplicity of filaments, said power being at least 3 kW, (d) maintaining growth conditions for sufficient time to grow a pre-determined thickness of diamond.

Figure 9:
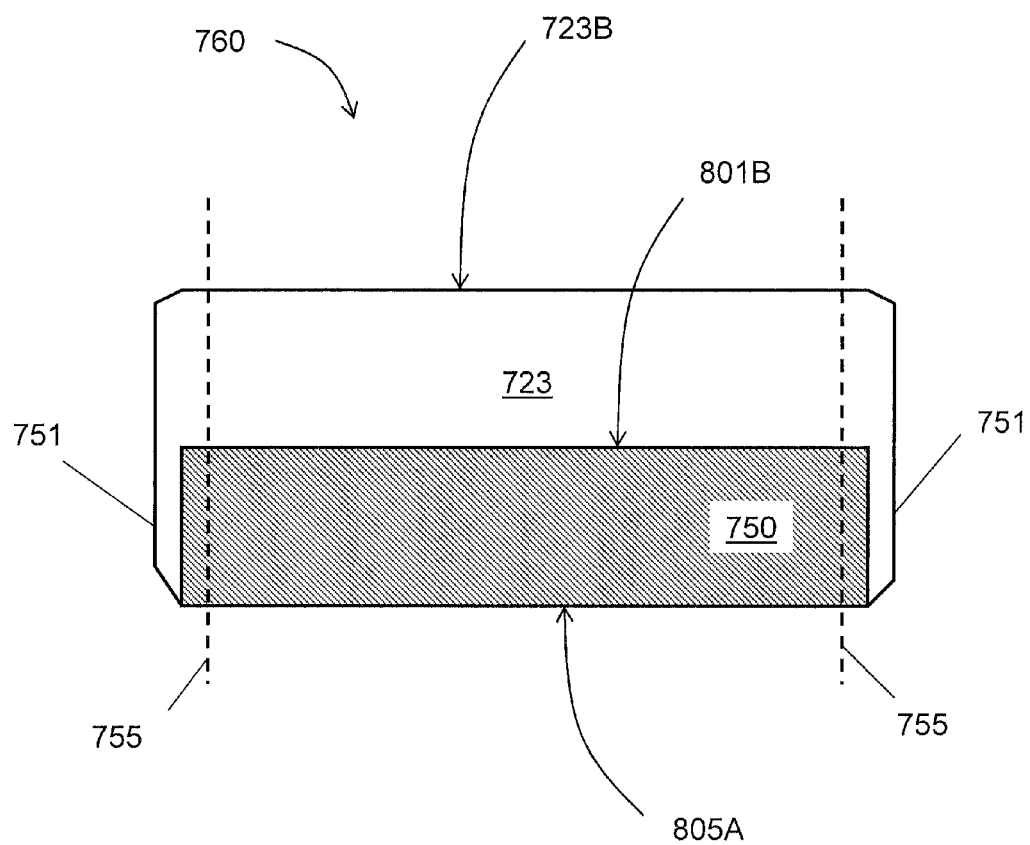
FIG. 9 depicts laser trimming of wafer 760.

In one embodiment, the wafer size is approximately 100 m and the thickness of the diamond layer is 100 um±20 um, but may range between 20 and 300 um. The completed structure is shown in FIG. 9 and denoted 760. The diamond layer is denoted 723 and its last-grown surface 723B.

STEP 117 "MEASURE BOW": Upon removal from the vacuum chamber 901, the third value of bow on the wafer sandwich 760 is measured with the surface 723B up. The bow should be convex (center higher than the edge, i.e., third bow value is positive). In one embodiment, the third bow value is less than 1 mm for an approximately 100 mm diameter wafer 750 with 100 um-thick diamond layer 723 and wafer 750 with nominal thickness of 650 μm. The result of this condition is a low bow of the completed wafer 770 in a later step 120. In another embodiment, the third bow is between 650 um and 950 um on a 100 mm wafer sandwich 750 with 100 um diamond thickness. The key requirement in achieving flat GaN/diamond engineered wafers 770 and 780 in step 120 is that the third bow of the wafer sandwich 760 is convex and limited to a pre-determined value.

STEP 118 "LASER TRIM": The diamond-coated wafer 750 illustratively shown in FIG. 9 comprises of the wafer sandwich 750 coated with a layer of diamond 723. The edges of the wafer sandwich 750 are also in part coated with diamond as illustrated with 751. The wafer 750 is now trimmed to remove the edges coated with diamond in places indicated with dashed lines 755. The distance between the laser-trimming 755 is slightly less than the diameter of the wafer sandwich 750 by typically 1 mm overall.

STEP 119 "REMOVE CARRIER WAFER": The surface 808A of the carrier wafer 720 coated with glass 808 both of which are a part of the wafer sandwich 750 are now removed using wet chemical processing. First the glass 808 is exposed to HF for 1 min to remove the glass 808, Piranha etch comprising of a mixture $CH_3COOH:HNO_3:HF$ (2:2:1 by volume) followed by etching in Tetramethylammonium hydroxide (TMAH) $(CH_3)_4NOH$ to remove carrier wafer 720, the glasses 806 and 807, and polysilicon 805. This step reveals the silicon nitride 804.

Figure 10:
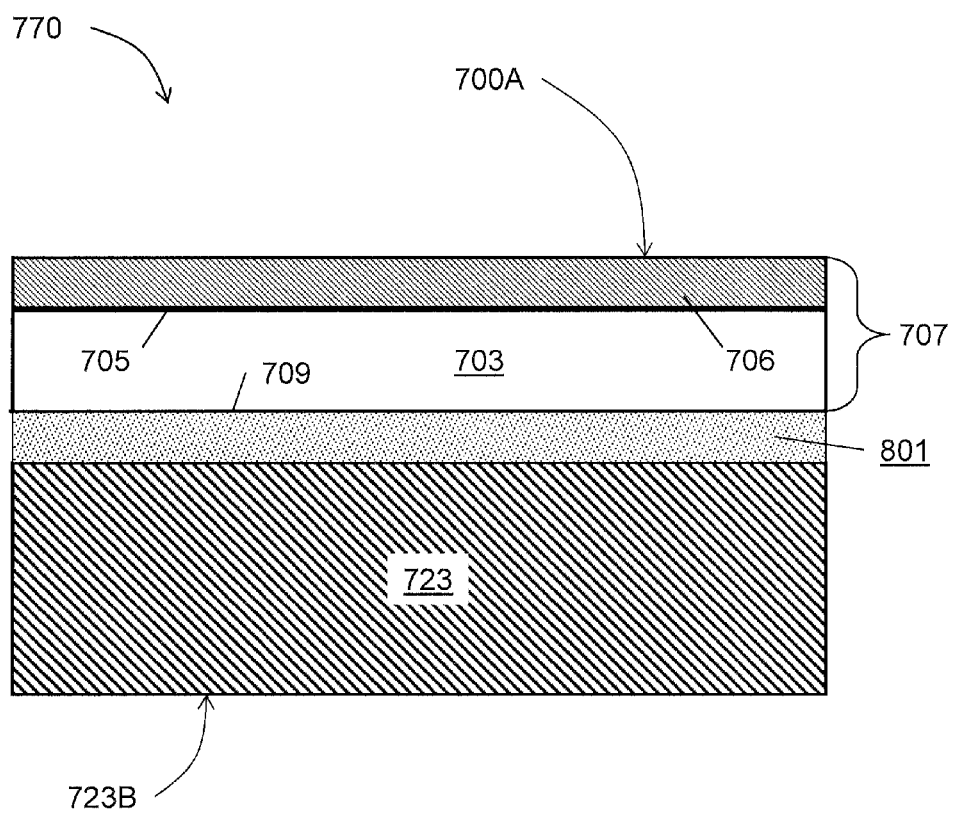
FIG. 10 illustrates one embodiment of a completed GaN-on-diamond engineered wafer manufactured using the preferred process.

STEP 120 "REMOVE SILICON NITRIDE": In one embodiment, silicon nitride 804 is removed by etching in concentrated HF with etch rate that is approximately 10 nm/min. This process reveals the original active layers 707 of the as-grown epilayers. The resulting engineered wafer is denoted wafer 770 and its structure is illustrated in FIG. 10. The engineered wafer 770 comprises of active layers 707, silicon nitride diamond nucleation layer 801, and diamond wafer 723.

Figure 11:
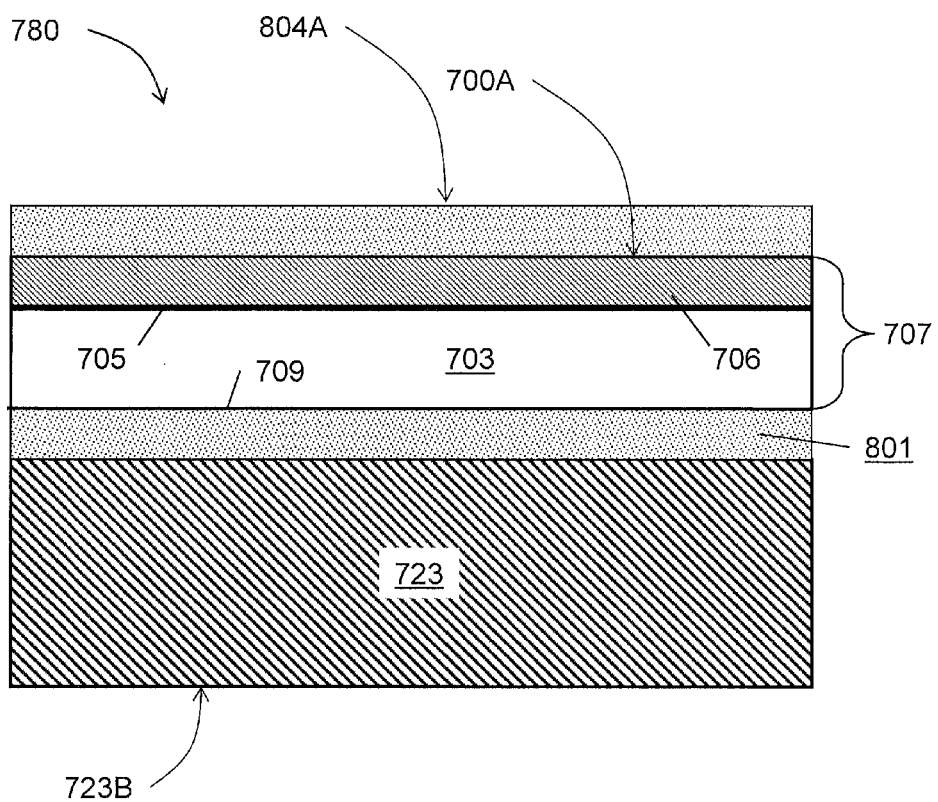
FIG. 11 shows an alternative embodiment of a completed GaN-on-diamond engineered wafer manufactured using the preferred process.

In another embodiment, step 120 is omitted. This is the case when the devices to be manufactured on this wafer will use the nitride layer 804. For example, the remaining silicon nitride layer may be used as a passivating layer in a high-electron mobility transistor. In this embodiment, the result of the process is engineered wafer 780, illustrated in FIG. 11. The engineered wafer 780 comprises of active layers 707, silicon nitride diamond nucleation layer 801, diamond wafer 723, and silicon nitride layer 804. In one embodiment, the silicon nitride 804 is in-situ silicon nitride. In another embodiment, the silicon nitride 804 is thermally grown silicon nitride.

Clearly, various modifications of the presented steps for manufacturing GaN-on-diamond wafers are possible without departing from the invention: Varying the thickness of the plates in steps 109, the times and temperatures in steps 110, 112, 115, and 116. The apparatuses disclosed in steps 109 and 116 may also be used to manufacture a variety of other innovative devices and wafer structures.

It is also clear that the preferred methods may be used for manufacturing of engineered wafers that will be used for manufacturing of light-emitting devices, such as, light-emitting diodes, lasers, and super-luminescent light-emitting diodes by varying the specific of the active layer design. For this purpose, it is clear that modifying the crystal orientation of the active layer to suit any of the mentioned application is possible without departing from the spirit of the invention. Specifically, the active layers may be polar, semi-polar, or non-polar. Additionally, the high-electron mobility transistor designed above may be used for power management applications in which the buffer layer thickness and the specific of the epilayer design may be altered to allow for high breakdown voltage. The preferred methods may be used to also manufacture high-voltage Schottky diodes.

While certain representative embodiments and details have been shown for purposes of illustrating the invention, it will be apparent to those skilled in the art that various changes in the methods and apparatus disclosed herein may be made without departing from the scope of the invention which is defined in the appended claims.

What is claimed is:

1. A substrate prepared for synthetic diamond deposition comprising:
   (a) a silicon wafer of thickness greater than 0.2 mm;
   (b) a layer of glass;
   (c) a layer of polysilicon;
   (d) a first silicon nitride layer;
   (e) a multilayered structure layer including at least one layer of gallium nitride; and
   (f) a second silicon nitride layer with thickness not greater than 100 nm,
   wherein the layer of glass bonds the silicon wafer to the layer of polysilicon, the first silicon nitride layer is disposed on the layer of polysilicon, the multilayer structure including at least one layer of gallium nitride is disposed on the first silicon nitride layer, and the second silicon nitride layer is disposed on the multilayer structure including at least one layer of gallium nitride, the second nitride layer having an exposed surface prepared for synthetic diamond deposition.

2. The substrate of claim 1, wherein said gallium nitride layer features Ga-facing surface parallel and proximal to said first silicon nitride.

3. The substrate of claim 1, wherein a surface of said gallium nitride layer is a non-polar or semi-polar surface of gallium nitride.

4. The substrate of claim 1, wherein said glass has a melting temperature above 1000° C.

5. The substrate of claim 1, wherein said second silicon nitride layer is an in-situ silicon nitride.

* * * * *